March 31, 1970 HUNG CHANG LIN 3,504,293

AMPLIFIER APPARATUS INCLUDING FIELD EFFECT AND BIPOLAR TRANSISTORS SUITABLE FOR INTEGRATION

Filed Feb. 29, 1968

WITNESSES:

Bernard R. Giegucz

James F. Young

INVENTOR

Hung Chang Lin

BY

Gordon H. Telfer

ATTORNEY 3,504,293

AMPLIFIER APPARATUS INCLUDING FIELD EFFECT AND BIPOLAR TRANSISTORS SUITABLE FOR INTEGRATION

Hung Chang Lin, Silver Spring, Md., assignor to Westinghouse Electric Corporation, Pittsburgh, Pa., a corporation of Pennsylvania

Filed Feb. 29, 1968, Ser. No. 709,343
Int. Cl. H03f *3/18*
U.S. Cl. 330—35 6 Claims

ABSTRACT OF THE DISCLOSURE

An amplifier having a field effect input stage and a bipolar output stage is provided with means acting as a current sink for DC drain current including another field effect transistor having matching characteristics, including drain current, to the first and a bipolar transistor having unity gain that draws the drain current so that its collector current matches the drain current. All the essential elements of the circuit may be provided within a unitary body of semiconductive material.

BACKGROUND OF THE INVENTION

Field of the invention

This invention relates to amplifier apparatus and particularly to amplifiers contained within semiconductor integrated circuits.

Description of the prior art

AC amplifiers are used to provide linear operation over a given pass band. As opposed to DC amplifiers, AC amplifiers are advantageous in that they do not have the problem of being sensitive to temperature and supply voltage variations. However, if the pass band of an AC amplifier must extend to audio or sub-audio frequencies, relatively large RC time constants are necessary that are prohibitive from the standpoint of integrated circuit design because of the excessive area required by high value resistors and capacitors.

It has been recognized that it is advantageous to employ field effect transistors and bipolar transistors in combination utilizing the high input impedance of field effect transistors and the good output characteristics of bipolar transistors. Such circuits, including integrated circuits, have been successfully made. Reference should be made to Stelmak 3,173,101, Mar. 9, 1965, and Lin et al. 3,210,677, Oct. 5, 1965, for further description of field effect-bipolar transistor amplifiers, sometimes called unibi amplifiers, as are known to the prior art.

Among the drawbacks of these circuits has been the fact that the transconductance $g_m$ of a field effect transistor increases with increasing DC drain current $I_D$. For MIS transistors, the transconductance varies in accordance with the following relation, in the saturation region of operation:

$$g_m = \frac{2I_D}{V_G - V_T}$$

where $V_G$ is the gate voltage and $V_T$ is the threshold voltage. In the scheme of Patent 3,173,101, this DC drain current is also amplified by the bipolar transistor and may result in excessive collector current. As one approach a resistor may be connected between the base and emitter of the bipolar transistor as a bleeder. However, this shunts the signal current and the effective current gain is reduced. Additionally, variations in field effect transistor characteristics result in wide fluctuations in the amplified collector current.

As disclosed in the above-mentioned Patent 3,210,677 of Lin et al., an additional field effect transistor may serve as a current sink for the input field effect amplifier stage with the bipolar transistor connected to the common point between the two field effect transistors. The disadvantages of this arrangement are that a negative power supply is required to bias the amplifier element into saturation and to match the current of the second field effect transistor while a positive power supply is necessary to provide the working current.

SUMMARY OF THE INVENTION

The present invention overcomes the disadvantages of previous versions of field effect-bipolar amplifiers by including means acting as a current sink for the DC drain current of the field effect amplifier without requiring supply voltages of opposite polarities. A second field effect transistor, having characteristics matching the first and operated under the same conditions produces the same drain current. A unity gain transistor is provided by a second bipolar transistor that may be like the bipolar amplifier with a diode in shunt across the base and emitter. The unity gain transistor draws the drain current of the field effect amplifier element.

The field effect transistor elements may be provided by any of the known junction unipolar or MIS types. However, the further description will assume the use of MIS transistors as are generally prefered for controlled characteristics. The matching between the field effect transistors may be provided by integrating them in the same body of material. Similarly, matching between the bipolar elements may be readily achieved by integration. In a preferred form of the invention, all of the transistors are contained within a unitary body of semiconductive material.

DESCRIPTION OF THE PREFERRED EMBODIMENTS

Figure 1:
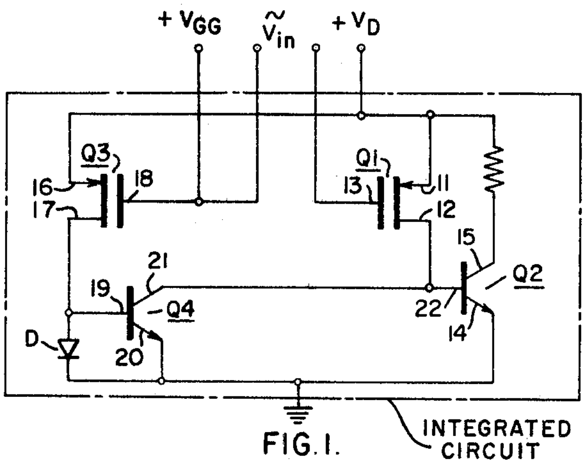
FIGURE 1 is a circuit schematic of one embodiment of the present invention.

In the circuit of FIG. 1 is shown an MIS transistor Q1 having source, drain and gate electrodes 11, 12, and 13, respectively, of which the drain electrode 12 is connected to the base 22 of a bipolar transistor Q2 to provide an amplifier substantially in the manner of the above-mentioned prior art. Transistor Q2 also has emitter and collector electrodes 14 and 15, respectively. A current sink for the DC drain current of Q1 is provided by another MIS transistor Q3 like the first and fed from the same gate voltage $V_{GG}$, signal source $V_{in}$ and drain supply $V_D$ so that it has the same DC drain current Q3 has source, drain, and gate electrodes 16, 17, 18, respectively. A unity gain bipolar transistor is also provided consisting of a transistor Q4 having base, emitter and collector electrodes 19, 20, and 21, respectively, that has characteristics matched to those of Q2 but with diode D connected across the base and emitter. The unity gain transistor draws the drain current of Q1. Since the collector 21 of Q4 is clamped by the base-emitter junction of Q2, Q4 is not saturated and the collector current of Q4 matches the drain current of Q1. The signal voltage is applied to the gate of Q1. The signal drain current is amplified by Q1 but does not flow into the collector of Q4 to Q4's very high output impedance.

The operation of this circuit depends on matching between field effect transistors and their general characteristics but not necessarily as to the absolute values of transconductances. Matching of the bipolar transistor characteristics is also necessary for obtaining unit current gain. These results are relatively easy to accomplish through integrated circuit fabrication wherein like transistor elements can be formed simultaneously. Structures including both MIS and bipolar transistors connected into a circuit in accordance with this invention may be formed by the techniques disclosed in copending application Ser. No. 709,344, filed Feb. 29, 1968, by Lin and Yu and assigned to the asignee of the present invention. Thus the elements within the dashed line of FIG. 1 are integratable.

Figure 2:
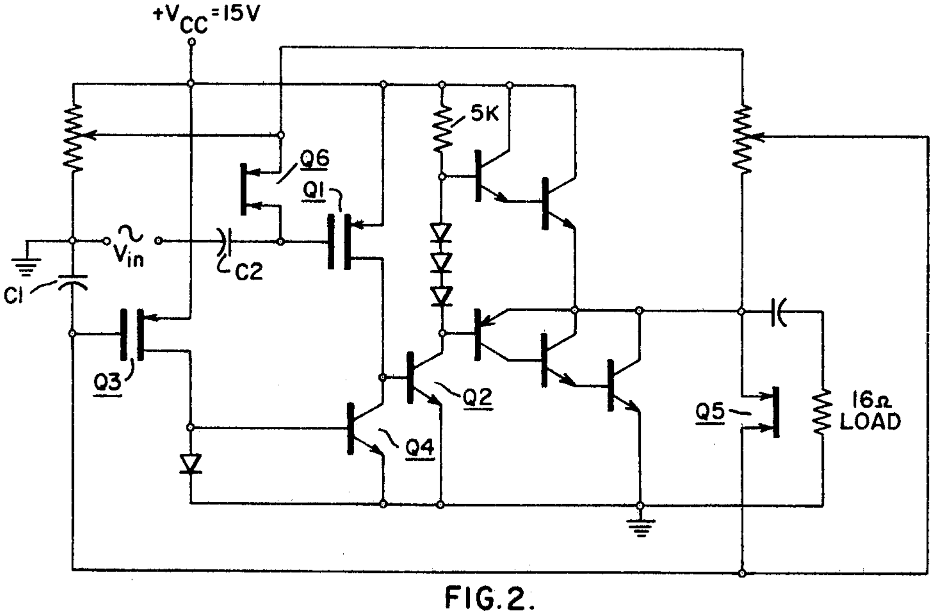
FIG. 2 is a circuit schematic illustrating a particular application of the basic circuit of FIG. 1.

In FIG. 2, the elements of FIG. 1 are connected in a circuit for an AC amplifier. The basic circuit of FIG. 1 provides the input circuit for a multi-stage amplifier. The collector of Q2 is connected to a quasi-complementary class B output stage to increase the power output in accordance with the description contained in the article in Electronics, September 1956, entitled "Quasi-Complementary Amplifier" by the presenet inventor. The output is degeneratively fed back to the gate of Q3 to stabilize the operating point. An additional transistor Q5, that may be an MIS transistor, as illustrated, or a bipolar transistor, is biased to cut-off and used as a high resistance in the feedback path and by-passed by a low value capacitor C1 of about 50 picofarads to minimize AC degeneration. A similar scheme is used to bias the input MIS transistor Q1 using MIS transistor Q6 and to present a high input impedance so that a low value coupling capacitor C2 of about 50 picofarads can be used. With this arrangement all the elements can be integrated. The high input impedance makes it possible to operate the amplifier down to sub-audio frequencies.

Actual integrated circuit amplifiers as described have been made having a power output of 1 watt, a voltage gain of 40, harmonic distortion of less than 3% and frequency response (−3 db) over the range from 0.1 to 100,000 hertz. The frequency of the amplifier can be extended to video frequencies by applying more negative feedback. When the output is fed back with a potentiometer, a gain variation from 0.75 to 1.25 can be obtained.

While the invention has been shown and described in a few forms only, it will be apparent that various changes and modifications may be made without departing from the spirit and scope thereof.

I claim:

1. Electronic amplifier apparatus comprising: a first field effect transistor having first source, drain, and gate electrodes, means to provide potential difference across said source and drain electrodes; a first bipolar transistor having first emitter, base, and collector electrodes, said bipolar transistor having said first base coupled to said first drain to provide successive amplification of signals applied to said first gate electrode; means to provide a current sink for DC drain current of said first field effect transistor requiring only operating potentials of the same polarity as said means to provide potential difference across said source and drain electrodes; said means to provide a current sink comprising a second field effect transistor having second source, drain, and gate electrodes with said second source coupled to said first source; a second bipolar transistor having second emitter, base and collector electrodes, said second drain coupled to said second base and said second collector coupled to said first base; and a diode coupled across said second base and emitter and poled in the same direction.

2. The apparatus of claim 1 wherein: said first and second field effect transistors have substantially matched characteristics and are contained within a unitary body of material; and said first and second bipolar transistors have substantially matched characteristics and are contained within a unitary body of material.

3. The apparatus of claim 2 wherein: all of said transistors are in the same body of material.

4. Electronic amplifier apparatus comprising: first and second MIS field effect transistors each having source and drain regions and a gate electrode; first and second bipolar transistors each having emitter, base and collector regions; said first MIS transistor having its source coupled to the source of said second MIS transistor and its drain coupled to the base of said first bipolar transistor and the collector of said second bipolar transistor; said first bipolar transistor having its emitter coupled to the emitter of said second bipolar transistor; said second MIS transistor having its drain coupled to the base of said second bipolar transistor; and a diode coupled across said base base and emitter of said second bipolar transistor and poled in the same direction.

5. The apparatus of claim 4 wherein: first potential source means is connected across said MIS sources and said bipolar transistor emitters to provide a working current; second potential source means is connected across said MIS gates and said emitters to bias said gate electrodes; and an AC signal source is coupled to said gates of said MIS transistors.

6. The apparatus of claim 4 wherein: all of said transistors and said diode are contained within a unitary body of semiconductor material.

References Cited

UNITED STATES PATENTS

| | | |
|---|---|---|
| 3,070,762 | 12/1962 | Evans. |
| 3,400,335 | 9/1968 | Orchard et al. |

ROY LAKE, Primary Examiner

J. B. MULLINS, Assistant Examiner

U.S. Cl. X.R.

330—38